United States Patent [19]
Yu et al.

[11] Patent Number: 6,103,616
[45] Date of Patent: Aug. 15, 2000

[54] METHOD TO MANUFACTURE DUAL DAMASCENE STRUCTURES BY UTILIZING SHORT RESIST SPACERS

[75] Inventors: Allen S. Yu, Fremont; Thomas C. Scholer, San Jose; Paul J. Steffan, Elk Grove, all of Calif.

[73] Assignee: Advanced Micro Devices, Inc., Sunnyvale, Calif.

[21] Appl. No.: 09/136,867

[22] Filed: Aug. 19, 1998

[51] Int. Cl.$^7$ .............................................. H01L 21/4763
[52] U.S. Cl. ...................... 438/622; 438/618; 438/634; 438/638
[58] Field of Search .................................... 438/618, 622, 438/634, 637, 671, 672, 675, 638

[56] References Cited

U.S. PATENT DOCUMENTS

| | | | |
|---|---|---|---|
| 5,635,423 | 6/1997 | Huang et al. | 438/638 |
| 5,741,626 | 4/1998 | Jain et al. | 430/314 |
| 5,916,823 | 6/1999 | Lou et al. | 438/738 |
| 6,037,213 | 3/2000 | Shih et al. | 438/253 |
| 6,037,664 | 3/2000 | Zhao et al. | 257/758 |

FOREIGN PATENT DOCUMENTS 410209273  8/1998  Japan .

*Primary Examiner*—Carl Whitehead, Jr.
*Assistant Examiner*—Jamie L. Davis
*Attorney, Agent, or Firm*—H. Donald Nelson

[57] ABSTRACT

A method of manufacturing semiconductor devices wherein a partially completed semiconductor device having a first and second layer of interlayer dielectric and a first and second etch stop layer has the second etch stop layer masked and etched with an etch pattern having dimensions of the trench structure to be formed in the second interlayer dielectric. The second layer dielectric and first etch stop layer are then masked and etched with an etch pattern having dimensions of the via structure to be formed in the first interlayer dielectric. The remaining portions of the photoresist is removed and exposed portions of the second layer of interlayer dielectric and the first layer of interlayer dielectric are then etched simultaneously. The via structure and trench structure are then simultaneously filled with a conductive material.

6 Claims, 6 Drawing Sheets

METHOD TO MANUFACTURE DUAL DAMASCENE STRUCTURES BY UTILIZING SHORT RESIST SPACERS

BACKGROUND OF THE INVENTION

1. Field of the Invention

This invention relates generally to a method of manufacturing high density, high performance semiconductor devices that have dual damascene interconnects. More specifically, this invention relates to a method of manufacturing high density, high performance semiconductor devices that have dual damascene structures that are formed with a reduced number of masks.

2. Discussion of the Related Art

The increased demand for higher performance semiconductor devices has required more complex process technologies and materials to be utilized in the manufacture of semiconductor integrated devices. One way to increase the performance of a semiconductor integrated device such as a microprocessor is to reduce the gate width of the field effect transistors in the device in order to achieve a high internal clock speed for the microprocessor. The reduced gate widths have increased the performance significantly, however, the interconnect structure of the microprocessor has proved to be a roadblock to further increase in performance. This is because as increased performance is required, more transistors require more wiring in the interconnect structure. The increased density of the wiring can result in a decrease in performance relating to RC delays. To counteract the degradation in performance due to the RC delays, additional layers, commonly referred to as metal layers, in which interconnects are formed are manufactured in the semiconductor device in order to separate the wiring in both the vertical and horizontal directions. These requirements have necessitated the development of novel approaches in the methods of forming interconnections that not only integrate fine geometry definition but also can be efficiently implemented into the manufacturing process.

One method of forming a trench is a method known as the damascene process, which comprises forming a trench by masking and etching techniques and subsequent filling of the trench with the desired conductive material. The damascene process is a useful method for attaining the fine geometry metallization required for advance semiconductor devices. A dual damascene process is a two step sequential mask/etch process to form a two level structure such as a via in a first metal layer connected to a metal line (in a trench) in a second metal layer.

The typical dual damascene process is to mask and etch a first layer of interlayer dielectric in the structure to form vias and then fill the vias with a conductive material. Once the vias have been formed, the next step is to form a second layer of interlayer dielectric on the first metal layer, mask and etch the second layer of interlayer dielectric to form trenches, and then fill the trenches with a conductive material. As is known in the semiconductor manufacturing art, the vias are in electrical contact with selected trenches to form a desired interconnect pattern, which forms an electrical circuit.

Each mask and etch step increases the total time and increases the complexity of the manufacturing process as well as potentially increasing the number of defects.

Therefore, what is needed is a manufacturing process for the forming of dual damascene structures that has a reduced number of mask and etch steps.

SUMMARY OF THE INVENTION

According to the present invention, the foregoing and other objects and advantages are obtained by a method of manufacturing semiconductor devices wherein a partially completed semiconductor device having a first and second layer of interlayer dielectric and a first and second etch stop layer has the second etch stop layer masked and etched with an etch pattern having dimensions of the trench structure to be formed in the second interlayer dielectric. The second layer dielectric and the first etch stop layer are then masked and etched with an etch pattern having dimensions of the via structure to be formed in the first interlayer dielectric. The remaining portions of the photoresist is removed and exposed portions of the second layer of interlayer dielectric and the first layer of interlayer dielectric are then etched simultaneously. The via structure and trench structure are then simultaneously filled with a conductive material. The first etch stop layer is formed from a material such as SiON, $Si_3N_4$ or other nitride material. The second etch stop layer, which also served as a hard mask, is formed from a material such as SiON, $Si_3N_4$, TiN or other nitride material. The layers of interlayer dielectric is formed from a low constant dielectric material such as $SiO_2$. The conductive material is selected from a material selected from tungsten, aluminum and copper.

The described method thus provides a method of manufacturing semiconductor devices wherein the number of masking steps is reduced and the final etch step of the first and second layers of interlayer dielectric are etched simultaneously.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1A:
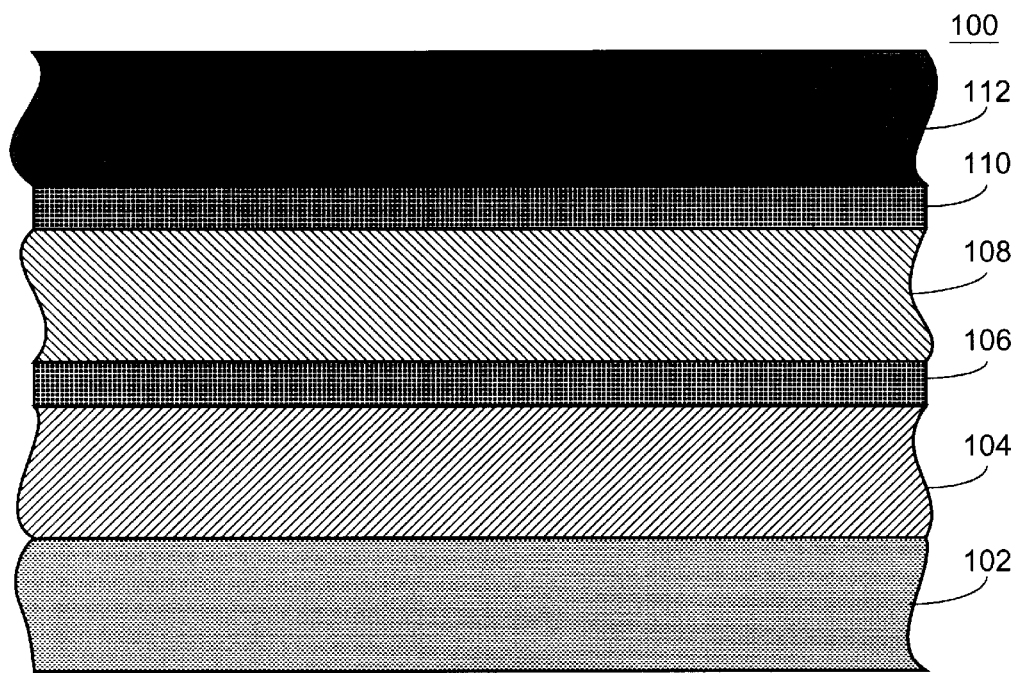
FIG. 1A shows a portion of a partially completed semiconductor device showing a first layer of interlayer dielectric formed on a semiconductor substrate in which active devices have been formed, a first etch stop layer formed on the first layer of interlayer dielectric, a second layer of interlayer dielectric formed on the first etch stop layer, a second etch stop layer formed on the second layer of interlayer dielectric and a first layer of photoresist formed on the second etch stop layer.

FIGS. 1A–1K show a method to form dual damascene interconnects in accordance with the present invention. FIG. 1A shows a partially completed semiconductor device 100. The partially completed semiconductor device 100 is formed in a semiconductor substrate on and in which active devices (not shown) are formed. The substrate and active devices are indicated generally at 102 and will not be discussed further since the methods of forming active devices in and on a semiconductor substrate are well known in the semiconductor manufacturing art and such methods of formation are not a part of the present invention. The surface of the substrate 102 is planarized and serves as a uniform flat surface on which to form further structures on the surface of the semiconductor substrate 102. A first layer of interlayer dielectric 104 is formed on the planarized surface of the semiconductor substrate 102. The first layer of interlayer dielectric 104 is typically formed from a low dielectric constant material such as silicon dioxide ($SiO_2$). The top surface of the interlayer dielectric 104 is planarized to serve as a flat surface for the formation of further layers. A boundary layer of etch stop layer 106 is formed on the surface of the interlayer dielectric 104. The etch stop layer 106 is typically formed from a nitride material such as silicon oxynitride (SiON) or silicon nitride ($Si_3N_4$). The purpose of the etch stop layer 106 is to stop a subsequent etch process from etching into the first interlayer dielectric 104. A second layer of interlayer dielectric 108 is formed on the surface of the first etch stop layer 106. The second layer of interlayer dielectric 108 is also formed from a low dielectric constant material such as silicon dioxide ($SiO_2$). A second etch stop layer 110 is formed on the surface of the second layer of interlayer dielectric 108. The second etch stop layer 110 can be formed from a nitride material such as silicon oxynitride (SiON), silicon nitride ($Si_3N_4$) and titanium nitride (TiN). A first layer of photoresist 112 is formed on the surface of the etch stop layer 110.

Figure 1B:
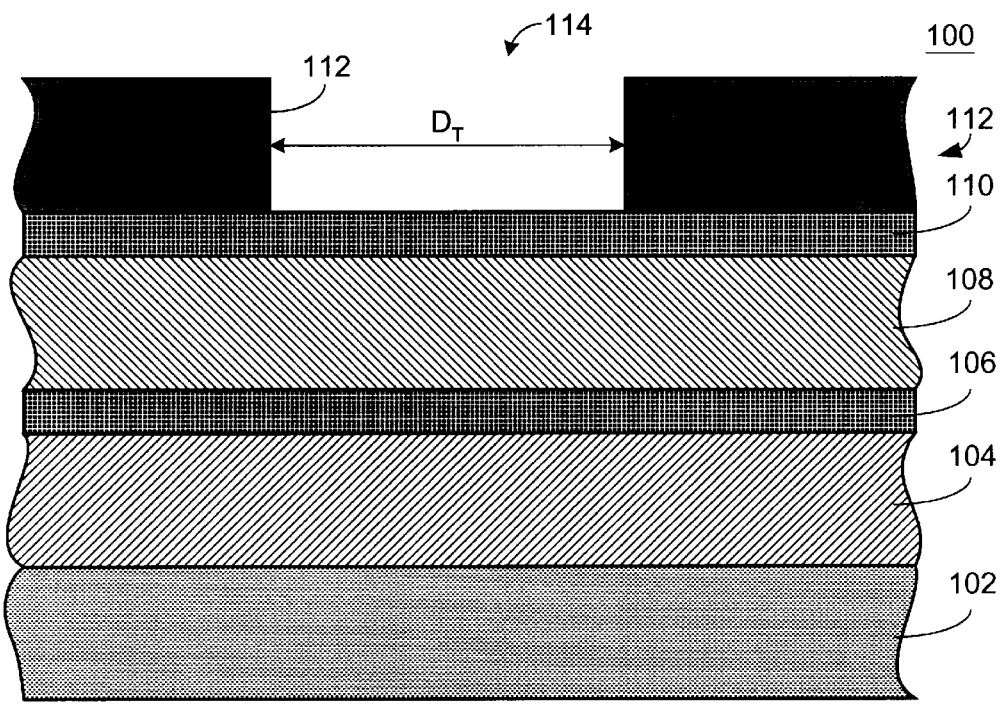
FIG. 1B shows the partially completed semiconductor device shown in FIG. 1A with the layer of photoresist patterned and etched.

FIG. 1B shows the partially completed semiconductor device 100 as shown in FIG. 1A with the layer of photoresist 112 patterned and etched. All etch process discussed herein are anisotropic etch processes, that is, etch processes that are directional as opposed to isotropic etch processes that etch in all directions. In addition, the etch processes and chemistries are well known in the art and will not be discussed as each etch process can be easily determined by a person of ordinary skill in the semiconductor manufacturing art. The dimensions of the etched portion 114 are the dimensions of a trench structure $D_T$ that will be formed in the second layer of interlayer dielectric 108. The etch process exposes a portion of the second etch stop layer 110 having dimensions of the trench structure $D_T$ to be formed in the second layer of interlayer dielectric 108.

Figure 1C:
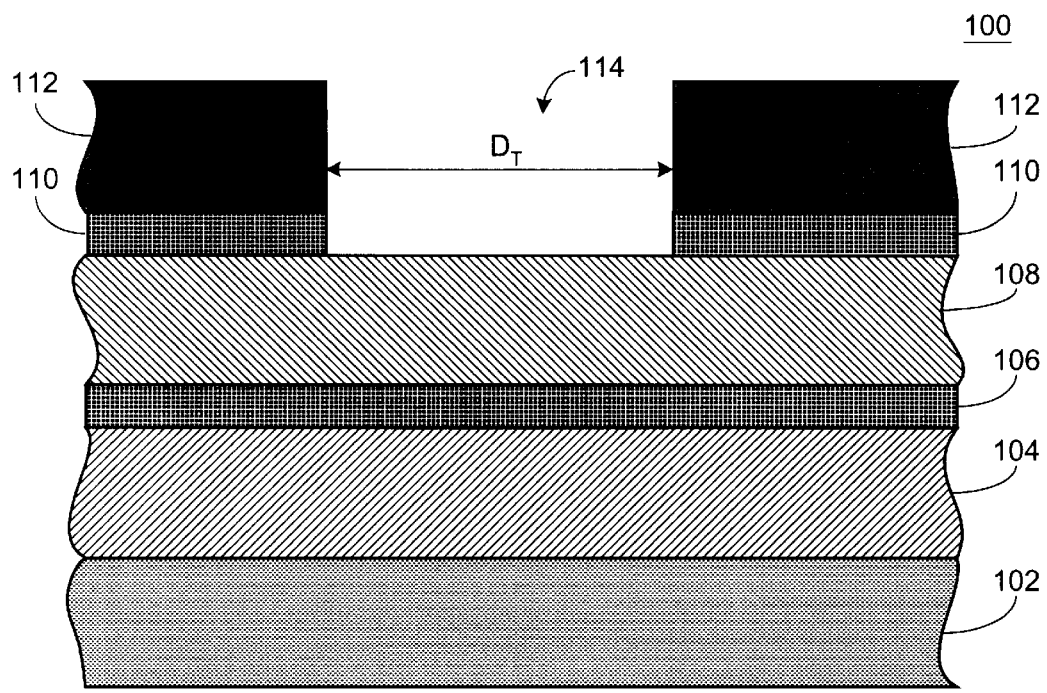
FIG. 1C shows the partially completed semiconductor device shown in FIG. 1B after an etch process to remove a portion of the second etch stop layer.

FIG. 1C shows the partially completed semiconductor device 100 as shown in FIG. 1B after an etch process to etch the exposed portion of the second etch stop layer 110.

Figure 1D:
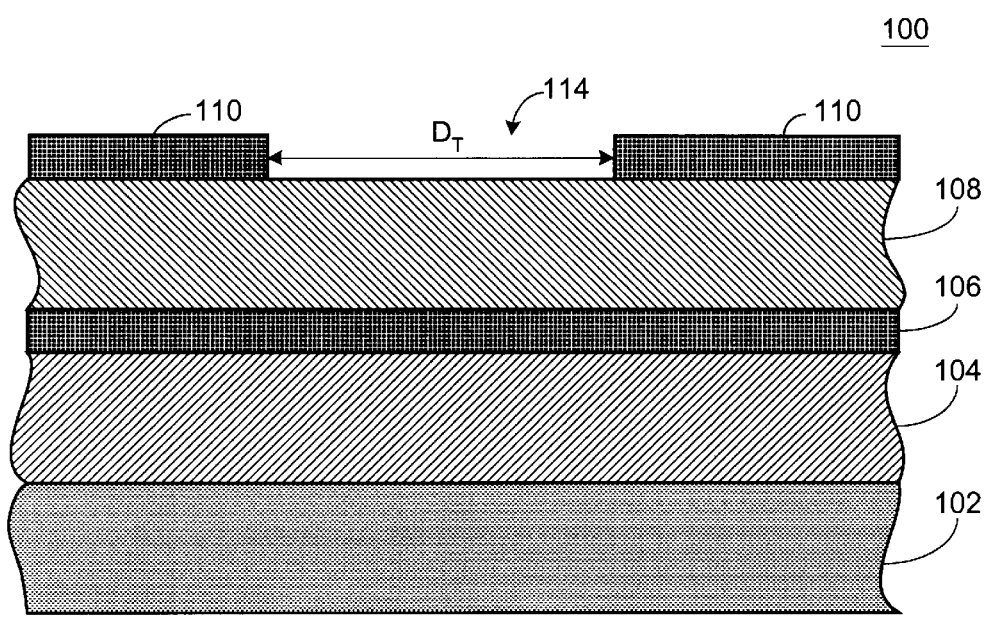
FIG. 1D shows the partially completed semiconductor device shown in FIG. 1C with the remaining portion of the first layer of photoresist removed.

FIG. 1D shows the partially completed semiconductor device 100 as shown in FIG. 1C with the remaining portions of the layer of photoresist 112 removed.

Figure 1E:
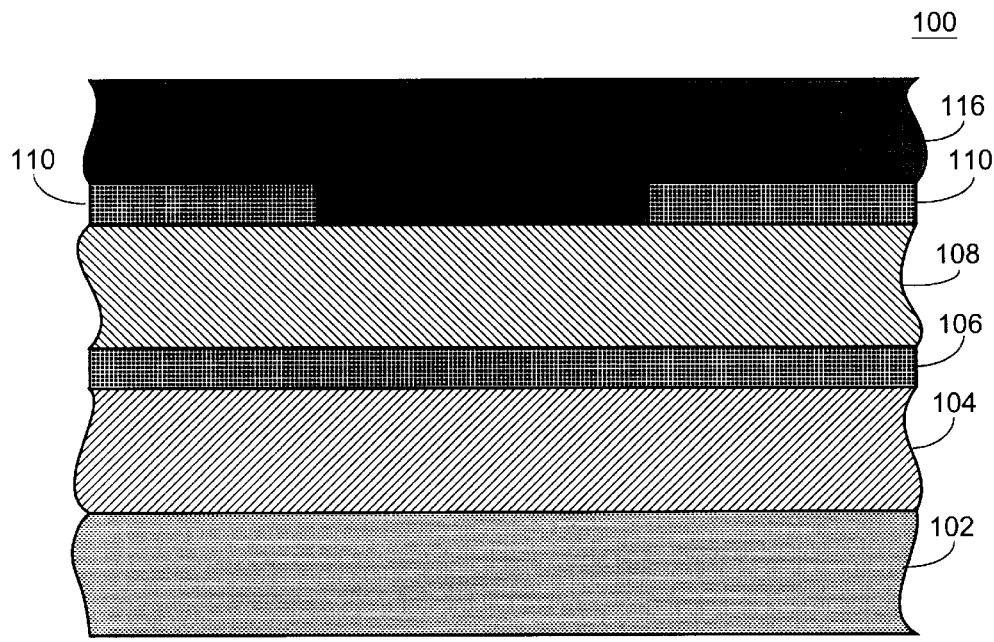
FIG. 1E shows the partially completed semiconductor device shown in FIG. 1D with a second layer of photoresist formed on the structure shown in FIG. 1D.

FIG. 1E shows the partially completed semiconductor device 100 as shown in FIG. 1D with a second layer of photoresist 116 formed on the surface of the structure as shown in FIG. 1D.

Figure 1F:
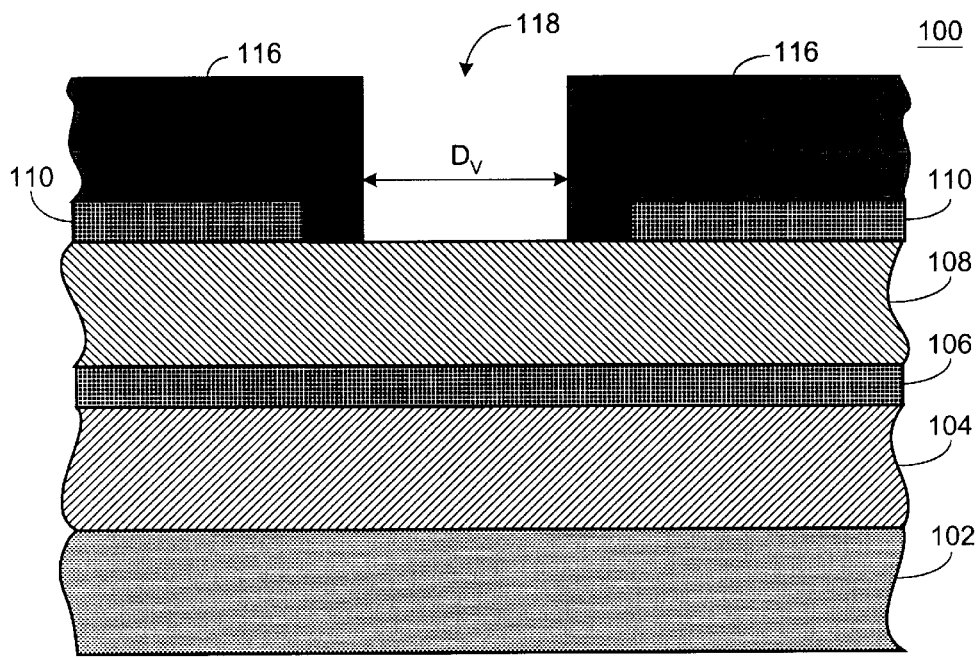
FIG. 1F shows the partially completed semiconductor device shown in FIG. 1E with the second layer of photoresist patterned and etched.

FIG. 1F shows the partially completed semiconductor device 100 as shown in FIG. 1E with the second layer of photoresist 116 patterned and etched. The dimensions of the etched portion 118 are the dimensions of a via structure $D_V$ that will be formed in the first interlayer dielectric 104. The etch process exposes a portion of the second layer of interlayer dielectric 108 having the dimensions of the via structure $D_V$ that will be formed in the first interlayer dielectric 104.

Figure 1G:
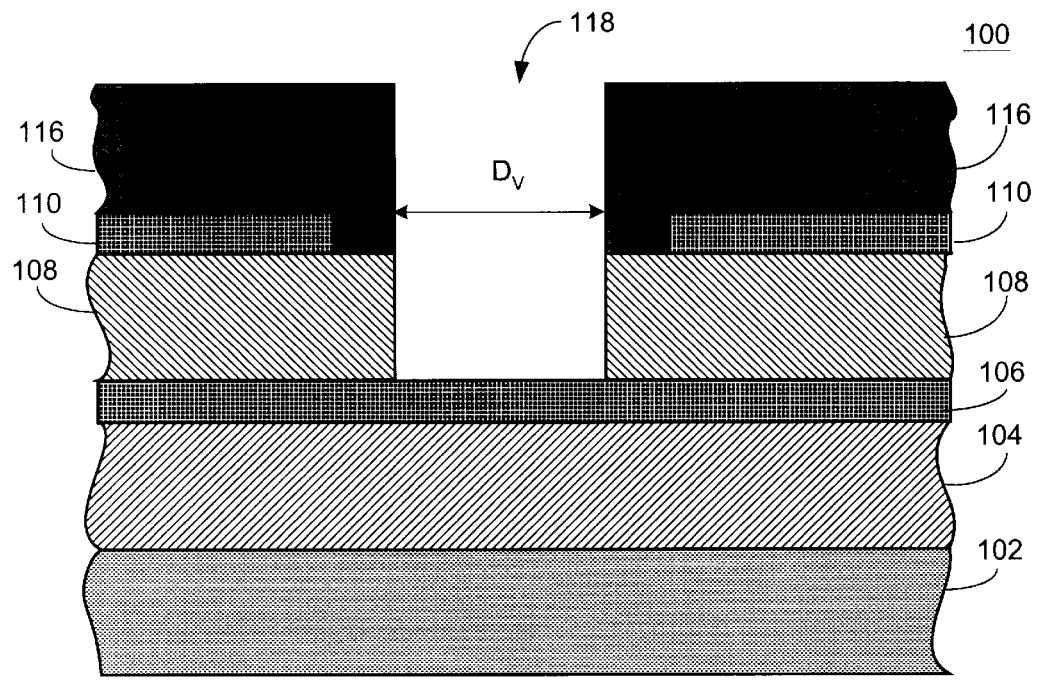
FIG. 1G shows the partially completed semiconductor device shown in FIG. 1F after an etch process to remove a portion of the second layer of interlayer dielectric.

FIG. 1G shows the partially completed semiconductor device 100 as shown in FIG. 1F after an etch process to etch the second layer of interlayer dielectric 108. The etch process etches the second layer of interlayer dielectric 108 down to the surface of the first etch stop layer 106. The etch process exposes a portion of the first etch stop layer 106 having the dimensions of the via structure $D_V$ to be formed in the first interlayer dielectric 104.

Figure 1H:
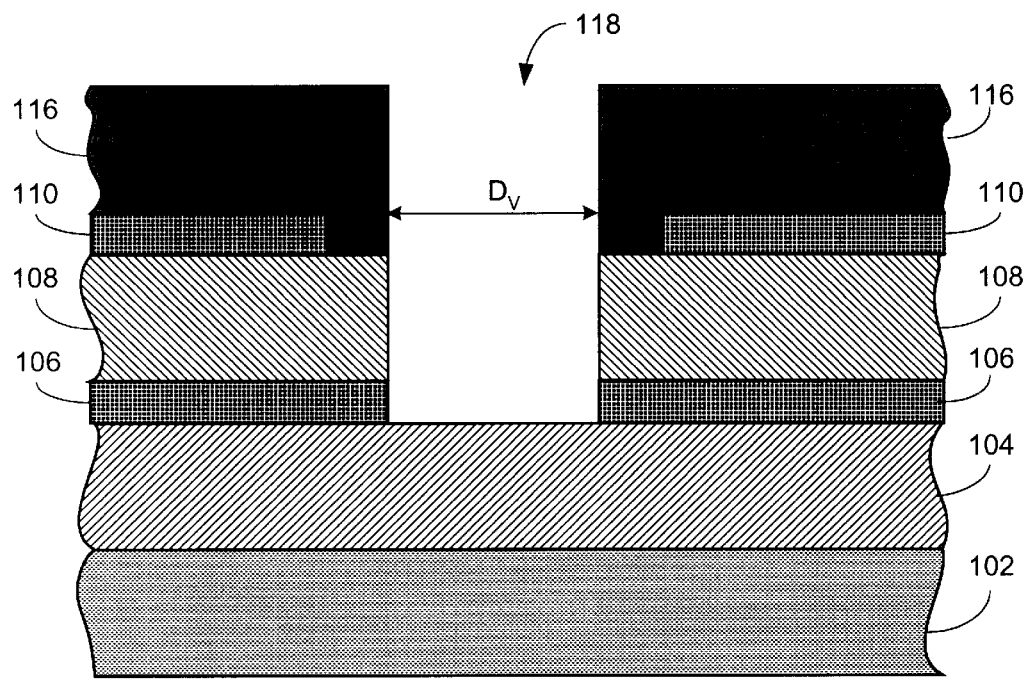
FIG. 1H shows the partially completed semiconductor device shown in FIG. 1G after an etch process to remove a portion of the first etch stop layer.

FIG. 1H shows the partially completed semiconductor device 100 as shown in FIG. 1G after an etch process to etch the exposed portion of the first etch stop layer 106. The etch process exposes a portion of the first layer of interlayer dielectric 104 having the dimensions of the via structure $D_V$ to be formed in the first interlayer dielectric 104.

Figure 1I:
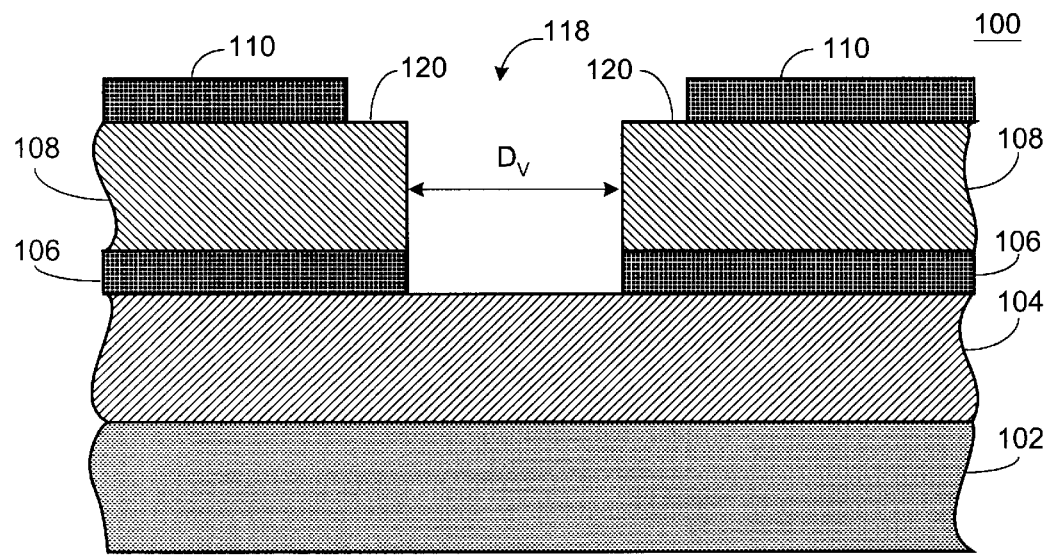
FIG. 1I shows the partially completed semiconductor device shown in FIG. 1H with the remaining portions of the second layer of photoresist removed.

FIG. 1I shows the partially completed semiconductor device 100 as shown in FIG. 1H with the remaining portions of the layer of photoresist 116 removed. The removal of the layer of photoresist 116 exposes portions 120 of the second layer of interlayer dielectric 108. In addition, the removal of the second layer of photoresist 116 reduces the aspect ratio, the aspect ratio being defined as the ratio of the depth structure to be etched and the width of the structure to be etched. The reduction of the aspect ratio improves the aspect ratio dependence etch (ARDC), also known as stop etch of the via into the first layer of interlayer dielectric. In this case, the ARDC would stop the etch process of the first layer of interlayer dielectric 104 before the etch process reached the surface of the semiconductor substrate 102. Because the etch process to etch an oxide is a physical type of etch, it is primarily an ion bombardment that generates a large amount of polymers. The large amount of polymers buildup on the sidewalls as the etch process proceeds. If the aspect ratio is too large, the polymer buildup can stop the etch process preventing the complete opening of the via. This would result in an open circuit and the circuit would be inoperative. One method that has been used is to increase the power during the etch process. However, the increase in power will consume more photoresist and generate more polymers.

Figure 1J:
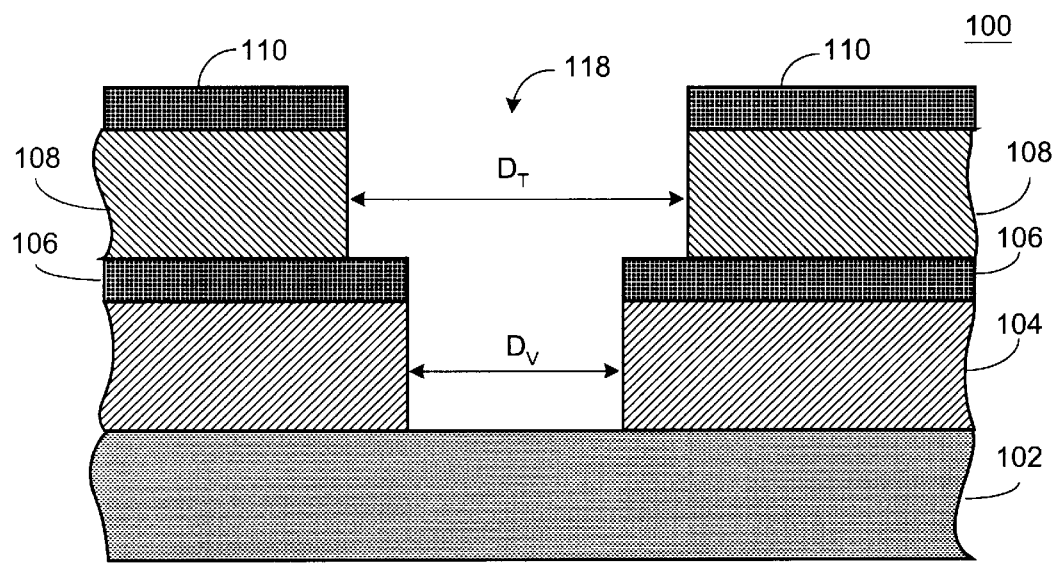
FIG. 1J shows the partially completed semiconductor device shown in FIG. 1I after an etch process that etches a portion of the second interlayer dielectric and a portion of the first interlayer dielectric.

FIG. 1J shows the partially completed semiconductor device 100 as shown in FIG. 1I after an etch process that removes exposed portions 120 of the second layer of interlayer dielectric 108 and the exposed portion of the first layer of interlayer dielectric 104. The etch process etches the second layer of interlayer dielectric 108 with dimensions of the trench structure $D_T$ and etches the first layer of interlayer dielectric 104 with dimensions of the via structure $D_V$.

Figure 1K:
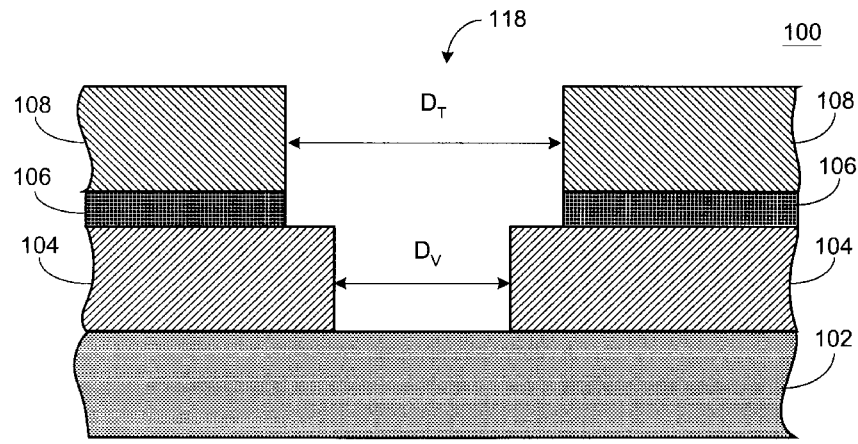
FIG. 1K shows the partially completed semiconductor device shown in FIG. 1J with the remaining portions of the second etch stop layer removed and the exposed portions of the first etch stop layer removed; and FIG. IL shows the partially completed semiconductor device shown in FIG. 1K with the etched portion of the structure filled with a conductive material.

FIG. 1K shows the partially completed semiconductor device 100 as shown in FIG. 1J with the remaining portions of the second etch stop layer 110 removed and the exposed portions of the first etch stop layer 106 removed.

Figure 1L:
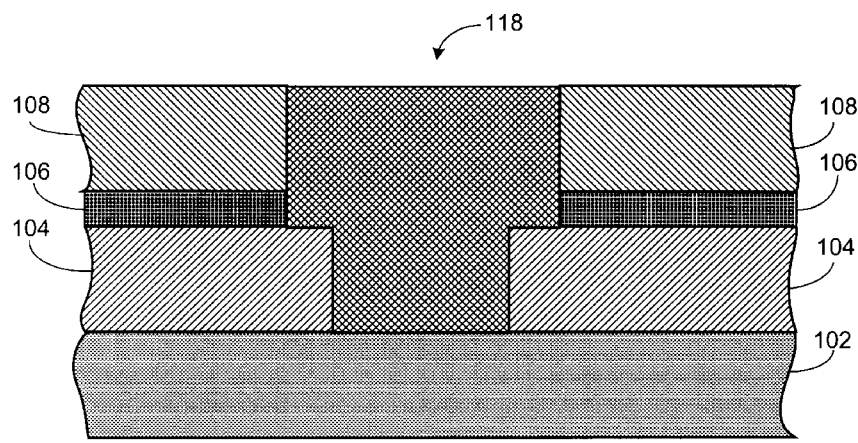

FIG. 1L shows the partially completed semiconductor device 100 as shown in FIG. 1K with the via structure and trench structure filled with a conductive material such as tungsten, aluminum or copper. As is known in the semiconductor manufacturing art, a barrier layer can be formed on the walls of the etched via structure and trench structure 118. The barrier layer can be formed from one of several materials including TiN (titanium nitride), TaN (tantalum nitride) or $W_2N$ (tungsten nitride).

In summary, the results and advantages of the method of the present invention can now be fully realized. The benefits of the present invention include the following:

1. The number of process steps is reduced;
2. Interface problems between the via structure and trench structure are reduced because the via structure and trench structure are formed simultaneously; and
3. Yields are improved because the number of steps is reduced thus reducing the potential defects.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, the method comprising:

forming a first layer of interlayer dielectric on a surface of a semiconductor substrate that contains active semiconductor devices;

forming a first etch stop layer on a surface of the first layer of interlayer dielectic;

forming a second layer of interlayer dielectric on a surface of the first etch stop layer;

forming a second etch stop layer on a surface of the second layer of interlayer dielectric;

forming a first layer of photoresist on a surface of the second etch stop layer;

etching the first layer of photoresist down to the surface of the second etch stop layer with an etch pattern having dimensions of a trench structure that will be formed in the second layer of interlayer dielectric wherein a portion of the second layer of interlayer dielectric is exposed having dimensions of the trench structure;

removing the first layer of photoresist;

forming a second layer of photoresist on the surface of the second etch stop layer and the exposed portion of the second layer of interlayer dielectric;

etching the second layer of photoresist down to the surface of the second layer of interlayer dielectric with an etch pattern having dimensions of a via structure to be formed in the first layer of interlayer dielectric;

etching the second layer of interlayer dielectric down to the surface of the first etch stop layer exposing a region of the first etch stop layer having dimensions of the via structure to be formed in the first layer interlayer dielectric;

etching the exposed portions of the first etch stop layer;

removing the second layer of photoresist exposing portions of the second layer of interlayer dielectric; and etching the exposed portions of the second layer of interlayer dielectric and the first layer of interlayer dielectric down to the surface of the semiconductor substrate exposing a region of the semiconductor substrate having dimensions of the via structure to be formed.

2. The method of claim 1 further comprising filling the via structure formed in the first layer of interlayer dielectric and the trench structure in the second layer of interlayer dielectric with a conductive material.

3. The method of claim 2 wherein the conductive material is selected from the group consisting of aluminum, tungsten and copper.

4. The method of claim 3 wherein the first etch stop layer is formed from a material selected from the group consisting of SiON and $Si_3N_4$ and the second etch stop layer is formed from a material selected from the group consisting of SiON, $Si_3N_4$ and TiN.

5. The method of claim 4 wherein the first and second layers of interlayer dielectric are formed from a low dielectric constant material.

6. The method of claim 5 wherein the first and second layers of interlayer dielectric are formed from silicon dioxide.

* * * * *